United States Patent [19]
Brown

[11] Patent Number: 4,820,976
[45] Date of Patent: Apr. 11, 1989

[54] TEST FIXTURE CAPABLE OF ELECTRICALLY TESTING AN INTEGRATED CIRCUIT DIE HAVING A PLANAR ARRAY OF CONTACTS

[75] Inventor: Candice H. Brown, San Jose, Calif.

[73] Assignee: Advanced Micro Devices, Inc., Sunnyvale, Calif.

[21] Appl. No.: 124,719

[22] Filed: Nov. 24, 1987

[51] Int. Cl.⁴ .................... G01R 1/04; G01R 1/073
[52] U.S. Cl. ................... 324/158 F; 324/72.5; 324/158 P
[58] Field of Search ............ 324/72.5, 73 PC, 158 P, 324/158 F; 200/83 N; 137/334

[56] References Cited

U.S. PATENT DOCUMENTS

| | | | |
|---|---|---|---|
| 3,453,545 | 7/1969 | Oates | 324/158 P |
| 3,842,346 | 10/1974 | Bobbitt | 324/158 F |
| 3,979,671 | 7/1976 | Meeker et al. | 324/158 F |
| 3,996,516 | 12/1976 | Luther | 324/158 F |
| 4,172,993 | 10/1979 | Leach | 324/158 F |
| 4,357,575 | 11/1982 | Uren et al. | 324/158 F |
| 4,616,406 | 10/1986 | Brown | 357/68 |
| 4,636,722 | 1/1987 | Ardezzone | 324/158 P |
| 4,734,872 | 3/1988 | Eager et al. | 324/73 PC |

FOREIGN PATENT DOCUMENTS

| | | | |
|---|---|---|---|
| 2544735 | 6/1976 | Fed. Rep. of Germany | 324/158 F |
| 0169068 | 10/1983 | Japan | 324/158 P |

OTHER PUBLICATIONS

"Cooling System for an Integrated Circuit Tester", by Chu et al., IBM Tech. Disc. Bull., vol. 13, #11, 4/71, p. 3547.

*Primary Examiner*—Reinhard J. Eisenzopf
*Assistant Examiner*—W. Burns
*Attorney, Agent, or Firm*—John P. Taylor

[57] ABSTRACT

A high performance test fixture is disclosed for testing integrated circuit chips which permits high throughput and good heat dissipation wherein flexible contact apparatus carried by said test fixture are urged into contact with the corresponding contacts on an integrated circuit chip using a pressurizable chamber wherein the flexible contact member carrying the test fixture contacts constitutes one wall of the chamber whereby pressurizing the chamber urges the flexible contact member and the contacts carried thereon against the chip. In a preferred embodiment, the chamber is pressurized by a cooling gas which compensates for the heat generated during the testing; and the test fixture is provided with apparatus to vibrate the contacts thereon in a lateral direction over the chip contacts to thereby remove oxide on the chip contacts to ensure a better electrical contact between the chip contacts and the test fixture contacts.

13 Claims, 4 Drawing Sheets

TEST FIXTURE CAPABLE OF ELECTRICALLY TESTING AN INTEGRATED CIRCUIT DIE HAVING A PLANAR ARRAY OF CONTACTS

BACKGROUND OF THE INVENTION

1. Field of the Invention

This invention relates to a test fixture capable of simultaneously testing a plurality of contacts arranged in a planar array on an integrated circuit die. More particularly, the invention relates to a test fixture having a contact member containing a plurality of electrical contacts which may be simultaneously urged under pressure against a plurality of contacts on an integrated circuit chip or die.

2. Description of the Related Art

Testing of conventional integrated circuit dies having contacts arranged around the periphery of the die may involve the use of catwhisker probes or test sockets with wiper contacts.

However, the testing of contacts on an integrated circuit die which may be arranged in a two dimensional array of contacts for subsequent connection to a two dimensional array of parallel leads as described in Brown U.S. Pat. No. 4,616,406, assigned to the assignee of this invention, creates problems in attempting to use such conventional testing apparatus because of the two dimensional array disposition of the contacts, and more particularly because of the relative inaccessibility of the inner contacts in the contact array.

One approach suggested was to provide a test fixture comprising an interconnect substrate with an array of pads arranged in general registry with an array of contacts or pins on an integrated circuit die. A special elastomer with conductive particle loading which would provide conductivity only in the direction of compression would be interposed between the integrated circuit die and the test fixture and then pressure would be applied to urge the die and the test fixture together.

However, it was found that the presence of the polymer between the contacts on the die and the contacts on the test fixture, while providing sufficient electrical contact, failed to provide adequate heat transfer from the contacts on the die to the contacts on the test fixture during the testing since the polymer, while providing electrical conductivity, did not provide sufficient thermal conductivity.

What is needed is a test fixture capable of simultaneously electrically connecting to all of the contacts on a die or chip, regardless of the location of the contacts on the die, which will provide high performance including high throughput rates and good thermal dissipation of the heat generated during the testing operation. Preferably, the test fixture should also be capable of dealing with the problem of oxide formation on the chip contacts which can result in faulty test results due to open circuits or high contact resistance.

SUMMARY OF THE INVENTION

It is, therefore, an object of the invention to provide a high performance test fixture for testing integrated circuit chips while permitting high throughput and good heat dissipation.

It is another object of the invention to provide a high performance test fixture for testing integrated circuit chips while permitting high throughput and good heat dissipation wherein contact means carried by a flexible portion of the test fixture are releasably urged into contact with the corresponding contacts on an integrated circuit chip.

It is yet another object of the invention to provide a high performance test fixture for testing integrated circuit chips while permitting high throughput and good heat dissipation wherein contact means carried by a flexible portion of the test fixture are releasably urged into contact with the corresponding contacts on an integrated circuit chip using a pressurizable chamber wherein the flexible portion carrying the test fixture contacts constitutes one wall of the chamber whereby pressurizing the chamber urges the flexible portion and the contacts carried thereon outwardly toward the chip.

It is still another object of the invention to provide a high performance test fixture for testing integrated circuit chips while permitting high throughput and good heat dissipation wherein contact means carried by a flexible portion of the test fixture are urged into contact with the corresponding contacts on an integrated circuit chip using a pressurizable chamber wherein the flexible portion carrying the test fixture contacts constitutes one wall of the chamber whereby pressurizing the chamber using a cold gas urges the flexible portion and the contacts carried thereon against the chip and the temperature of the cold gas compensates for the heat generated during the testing.

It is a further object of the invention to provide a high performance test fixture for testing integrated circuit chips while permitting high throughput and good heat dissipation wherein contact means carried by a flexible portion of the test fixture are urged into contact with the corresponding contacts on an integrated circuit chip using a pressurizable chamber wherein the flexible portion carrying the test fixture contacts constitutes one wall of the chamber whereby pressurizing the chamber urges the flexible portion and the contacts carried thereon against the chip, the chamber is pressurized by a cooling gas which compensates for the heat generated during the testing, and the flexible portion of the test fixture has means thereon to vibrate it in a lateral direction over the chip contacts to thereby remove oxide on the chip contacts to ensure a better electrical contact between the chip contacts and the test fixture contacts.

These and other objects of the invention will become apparent from the following description and accompanying drawings.

DETAILED DESCRIPTION OF THE INVENTION

Figure 1:
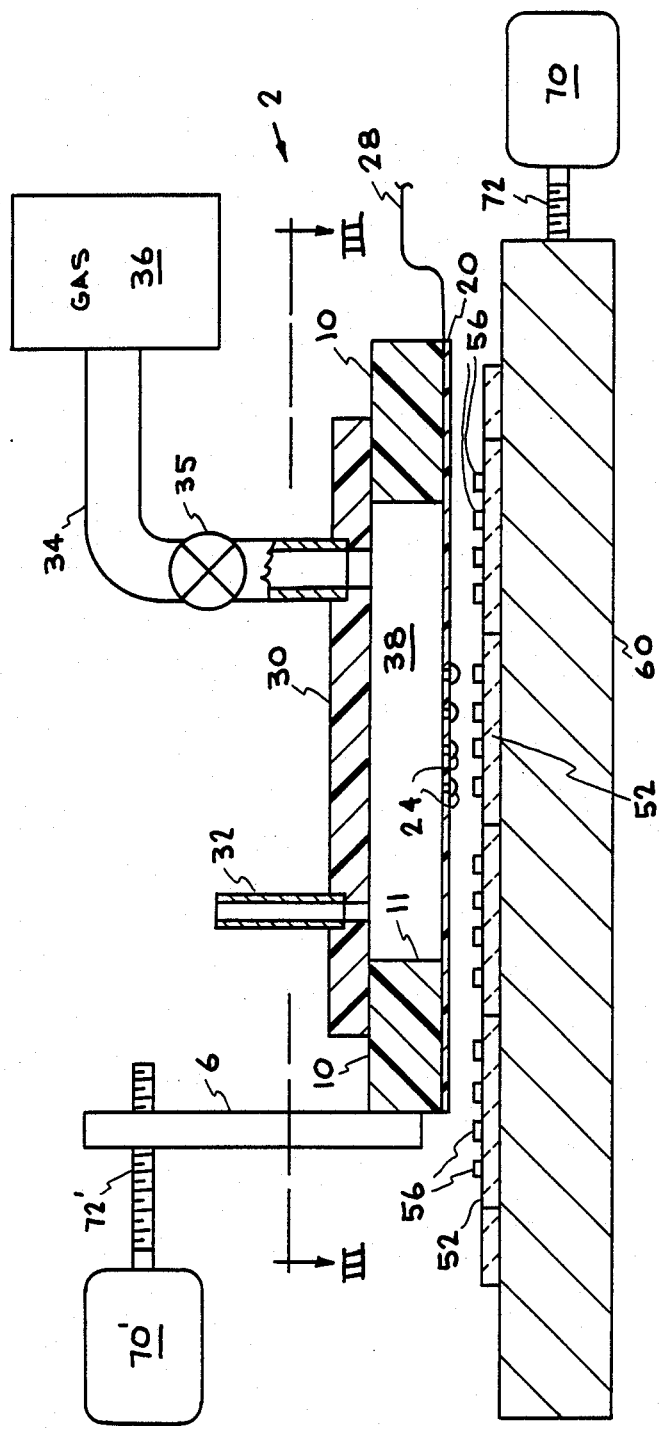
FIG. 1 is a vertical cross-section view of one embodiment of the test fixture of the invention.
Figure 3:
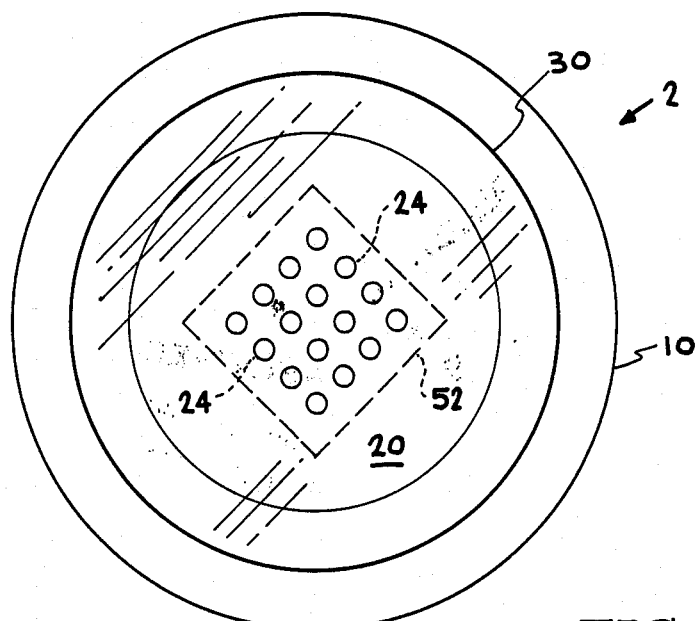
FIG. 3 is a top section view of the test fixture of FIG. 1 taken along lines III—III.

Referring now to FIGS. 1 and 3, the test fixture of the invention is generally shown at 2 comprising an outer support disc or ring 10 which is made of an insulating material such as a fiberboard or, preferably, a more flexible material such as "rigid flex", a material which comproses multilayers of polyimide sheeting known as "Kapton" usually having a thickness of from about 0.005 to 0.10 inches. Support ring 10 is mounted to test fixture support means 6 and has a central opening 11 therein which may be circular in shape.

Bonded to the underside or bottom surface of support ring 10 is a flexible transparent printed circuit contact member or card 20. Flexible contact member 20 is sealingly bonded to ring 10 using any suitable adhesive which will form a gas-tight seal with ring 10 such as, for example an epoxy sealant.

Flexible contact member 20 may be constructed of a 0.0015 to 0.0025 inch, preferably 0.002 inch thick transparent film material such as, for example, a polyimide film such as "Kapton", available from E. I. duPont de Nemours & Co., or a polyethylene terephthlate film such as "Mylar", also available from duPont.

Figure 2:
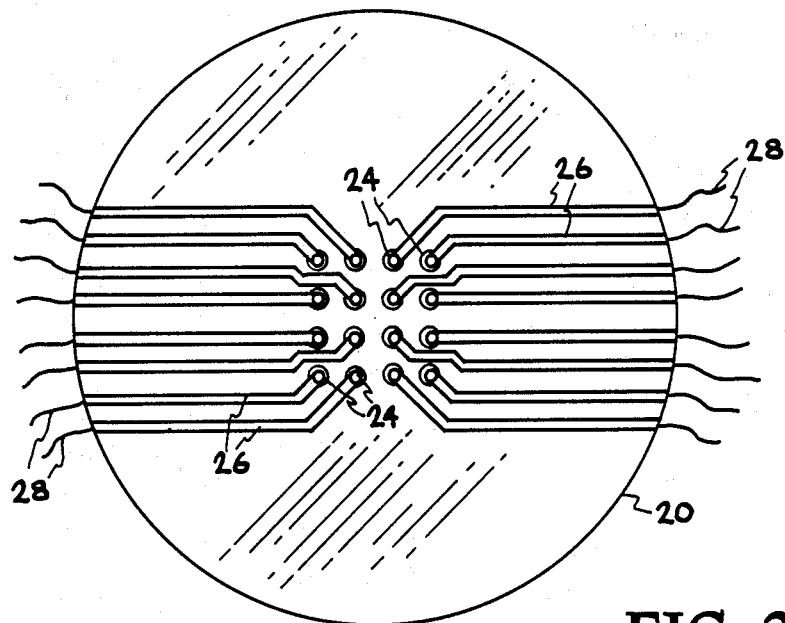
FIG. 2 is a top view of a central portion of the test fixture shown in FIG. 1.

Flexible contact film member 20 is provided with downwardly facing raised contacts or bumps 24 which extend through flexible member 20 to the opposite side. As best seen in FIG. 2, these contacts 24 are connected electrically on the opposite side of flexible member 20 to printed circuit board traces 26 on the upper surface of flexible member 20 to which, in turn, are connected contact wires 28 at the periphery of member 20 as best seen in FIG. 2. It should be noted that while openings are provided in flexible film member 20 to permit contacts 24 to extend through the film from the underside of the film (where contact will be made with the chip contacts) to the traces 26 on the opposite side of film 20, it is very important that such openings be completely filled or sealed, such as by plating, to provide a gas-tight seal for a purpose which will be explained below.

Sealingly mounted to the opposite surface of support ring 10 is a transparent cover member 30. Cover member 30, in combination with support ring 10 and flexible film member 20, forms a gas-tight chamber 38 with flexible film member 20 forming a flexible wall of the chamber as will be discussed below. Cover member 30 may comprise a glass dish, but preferably comprises a transparent plastic, such as Lucite or an acrylic material.

Cover member 30 is provided with an inlet tube 34 which is connected to a source of pressurized gas 36 through a valve 35. Cover member 30 is also preferably provided with an exit port 32 of preferably smaller diameter than entrance tube 34 for a reason which will be discussed below.

Chamber 38 may be pressurized by admitting gas through valve 35 and inlet tube 34 from gas source 36. Because gas outlet 32 is of smaller diameter than inlet tube 34, pressurized gas, admitted to chamber 38 from source 36, will exit chamber 38, but at a lower rate, thus permitting pressure to be maintained in chamber 38 as long as valve 35 is open. This constant flow of gas through chamber 38 is of particular importance when the gas flow functions not only as a pressurizing agent but also optionally as a coolant as well, as will be described below.

Test fixture 2 may be rigidly mounted by test fixture support means 6 over a movable table or support surface 60 on which is mounted a wafer 50, comprising a plurality of chips or dies 52, each having an array of contacts 56 thereon, and spaced a distance of about 10-20 mils from test fixture 2. Movable table 60 may be laterally moved, i.e., moved or indexed by precise amounts in the plane of wafer 50, using indexing means which may comprise a motor 70 coupled to table 60 by coupling means 72 which might, for example, comprise a worm drive coupled to a gear (not shown) on table 60. This permits a die 52 on wafer 50 to be precisely aligned beneath test fixture 2 before gas pressure is applied to urge test fixture contacts 24 against die contacts 56.

Alternatively, the wafer may be maintained in a constant or fixed position with test fixture 2 moved in precise increments over the specific chips of the wafer to be tested by, for example an indexing motor 70' coupled to test fixture support means 6 by a worm gear 72'. Any other commercially available indexing means may be used to move either test fixture 2 or wafer support table 60 to precisely align the contacts on a die of wafer 50 with the test contacts on test fixture 2. It should be noted in this regard that transparent cover member 30 and transparent flexible film member 20 facilitate the use of optical means, such as a microscope or an aligning beam of light, to be used in the alignment of test fixture 2 with wafer 50.

In the operation of the test fixture of the invention, either test fixture 2 or wafer support table 60 is moved to precisely align contacts 56 on die 52 of wafer 50 with test fixture contacts 24. Valve 35 is then opened permitting gas to flow through tube 34 into chamber 38 from gas source 36. The pressure of the gas in chamber 38 urges the wall comprising flexible contact member 20 to move outwardly until contacts 24 thereon come into engagement with contacts 56 on die 52. The die may then be tested by energizing the appropriate leads 28 via conventional test equipment.

When chamber 38 is pressurized, flexible film member not only generally moves outwardly to move contacts 24 thereon into electrical connection with contacts 56 on chip 52, but the flexibility of film member 20 permits film member 24 to compensate for irregular heights of the various chip contacts 56 on chip 52 which can occur due to plating or other processing of the chip during its construction. This attribute of the test fixture of the invention is very important because it permits simultaneous contact to be made with all of the contacts on the chip at the same time, even when the chip contacts are formed in a two dimensional array, despite minor differences or irregularities in chip contact height.

In a preferred embodiment, the gas used to pressurize chamber 38 comprises a cold gas such as $N_2$ from a liquid nitrogen tank so that chamber 38 is maintained at a very cool temperature, e.g., about $-65°$ to about $0°$ C. Heat, generated within die 52 during testing, is then transmitted through die contacts 56 to test fixture contacts 24 which are, in turn, cooled by the cold gas in chamber 38 which comes in contact therewith. Furthermore, by providing exit port 32, there is assured a constant flow of such cool gas through chamber 38 and thus heat generated by the die being tested is efficiently dissipated by test fixture 2.

Figure 4:
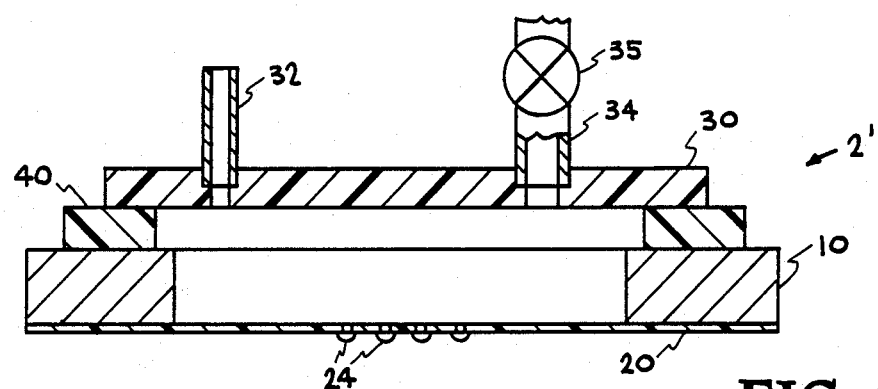
FIG. 4 is a vertical cross-section view of another embodiment of the test fixture of the invention.

FIG. 4 shows another embodiment of the invention where a rigid ring 40 is optionally sealingly mounted to support ring 20 and cover member 30 is, in turn, seal to rigid ring 20. Rigid ring 40 may comprise any rigid material, including even a metal ring although rigid insulating materials such as, for example, rigid plastic materials, are preferred.

Figure 5:
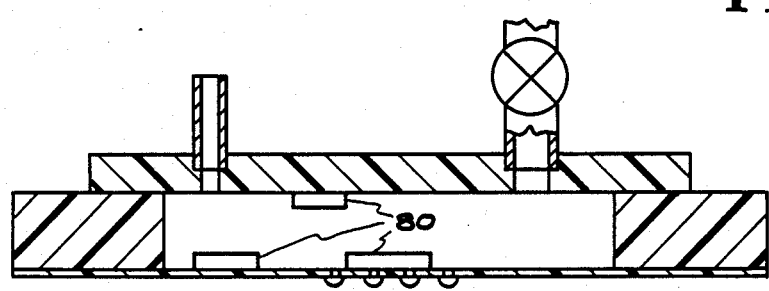
FIG. 5 is a vertical cross-section view of yet another embodiment of the test fixture of the invention.
Figure 6:
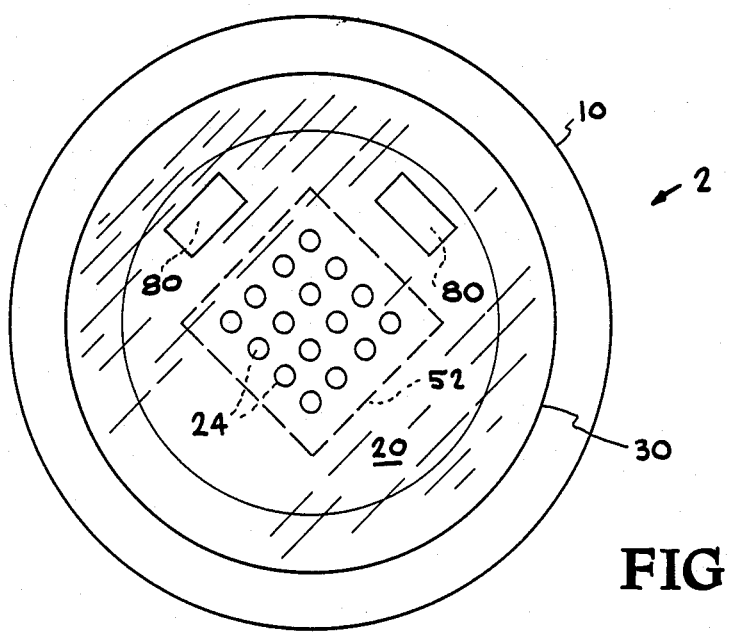
FIG. 6 is a top section view of the embodiment of FIG. 5 taken along lines V—V.

Turning now to FIGS. 5 and 6, another embodiment of the invention is illustrated wherein vibrating means are provided to clean the die contacts 52 to remove any residual oxide or other resistive films thereon which might interfere with the proper testing of the die. Such vibrating means may comprise transducer means which may comprise discreet transducers 80 mounted, respectively, either on flexible film contact member 20 or cover 30. For that matter, the exact position of the mounting of the vibrating means is not important as long as the vibrating means accomplished the purpose for which it is intended as will be described below.

Figure 7:
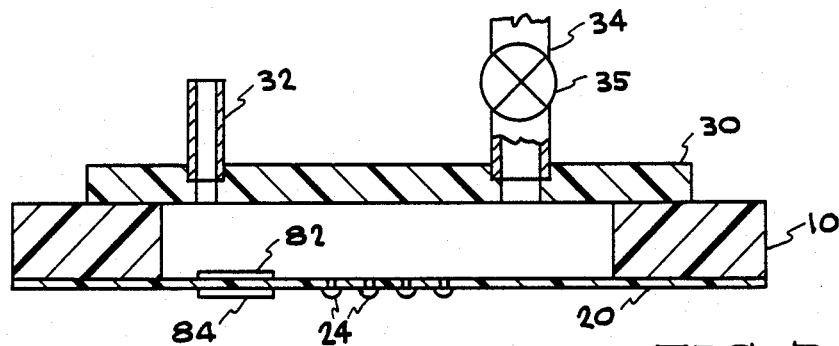
FIG. 7 is a vertical cross-section view of a variation of the embodiment shown in FIGS. 5 and 6.

Alternatively, the transducer means may be formed in situ by directly attaching metal plates 82 and 84 respectively to opposite surfaces of flexible contact member 20, as shown in FIG. 7, and using a piezoelectric plastic to form contact board 20. For example, a polyvinylidene fluoride (PVDF) film material such as "Kynar", available from Pennwalt Corp. may be used to form flexible film contact member 20 which will provide the desired insulation, transparency, and piezoelectric properties wherein flexible contact member 20 will vibrate when an AC voltage of ultrasonic frequency, i.e., a frequency of, for example, 48k Hertz is applied to metal plates 82 and 84.

In any case, energizing of either transducers 80 or metal plates 82 and 84 should cause the test fixture to vibrate laterally with respect to contacts 56 on die 52, i.e., vibrate in a direction parallel to the plane of wafer 50. If gas is admitted into chamber 38 at the same time, urging contacts 24 on flexible contact member 20 against die contacts 56, contacts 24 will laterally slide across the respective surfaces of die contacts 56 to scrub or scruff off any oxides or other materials on die contacts 56 which could otherwise prevent good ohmic contact therebetween.

Figure 8:
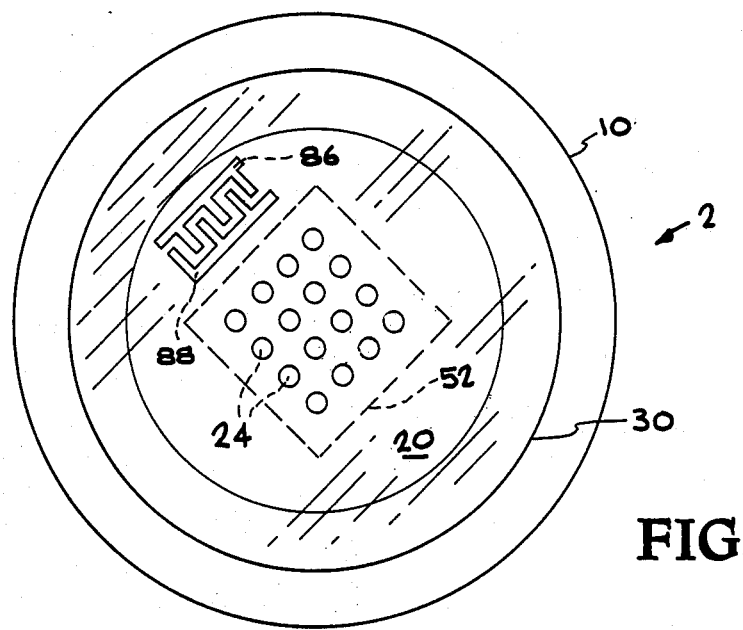
FIG. 8 is a top section view of another variation of the embodiment of FIGS. 5 and 6.

In FIG. 8, yet another variation of the embodiments of FIGS. 5–7 is illustrated wherein the transducer means comprise contacts formed on the same surface of flexible film member 20, which contacts may be in the form of plates such as plates 82 and 84 previously described (but now located on the same surface) or, as illustrated in FIG. 8, interdigitated contacts 86 and 88 which are formed on the same side of flexible film member 20 and which may be energized in the same manner as contacts 82 and 84.

In accordance, then, with the operation of the test fixture apparatus of the invention, die 52 to be tested is indexed to line up its contacts 56 in registry with the test fixture contacts 24, either by moving die 52 (via the support means 60 for wafer 50 which die 52 comprises a portion of) or by moving test fixture 2. Valve 35 is then energized to admit gas, preferably cold gas, into chamber 38 to urge flexible film contact member 20 and contacts 24 thereon against contacts 56 on die 52.

Preferably, the vibrating means, such as transducer means 80 (or 82-84 or 86-88), are then energized to clean contacts 56; and then, after shutting off the vibrating means, the die is tested by energizing contacts 24 through leads 28. The preferably cold gas continues to flow into chamber 38 and then out exit port 32 so that heat generated by die 52 during the test may flow through contacts 56 to contacts 24 where the flow of cold gas thereover will dissipate the heat generated during the test.

Figure 9:
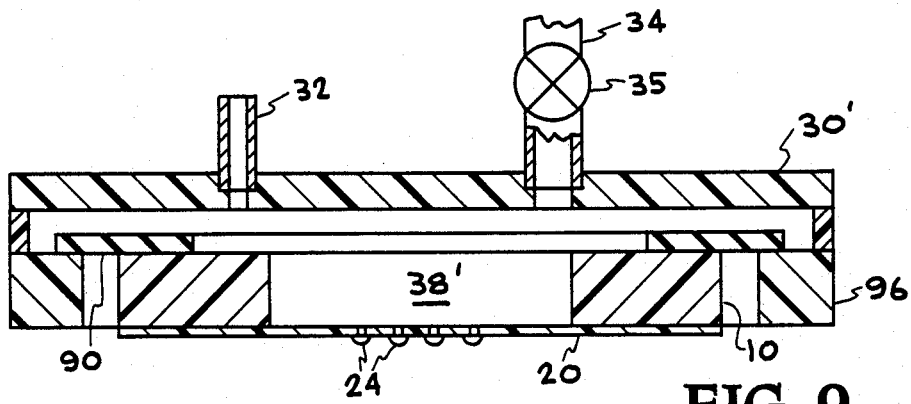
FIG. 9 is a vertical cross-section view of yet another embodiment of the invention.

In FIG. 9, yet another embodiment is shown wherein flexible support ring 10, with flexible contact member 20 sealingly bonded thereto, is sealingly mounted to an outer rigid support ring 96 via an elastomeric type member 90 which may, for example, comprises any flexible nonconductive plastic material including natural or synthetic rubber or a silicon rubber material. Rigid support ring 96 may comprise a metal, ceramic, or rigid plastic material. Cover member 30' is sealed to rigid support ring 96 and chamber 38' then is defined by rigid support ring 96, elastomer 90, flexible support ring 10, flexible contact member 20, and cover 30'.

Thus, the invention provides a text fixture which is capable of efficiently making accurate contact simultaneously with all of the contacts on a die, including a die having a two dimensional array of contacts thereon and/or a die having contacts of uneven height; which is capable of dissipating heat generated by the die during the testing; and which is capable of cleaning the die contacts to remove oxides or other resistive materials which would otherwise interfere with the making of good ohmic connection between the die contacts and the test fixture contacts.

Having thus described the invention, what is claimed is:

1. A test fixture apparatus for testing an integrated circuit die wherein a plurality of contacts arranged in a two dimensional array on said integrated circuit die may be simultaneously moved into a position of electrical and thermal communication with a corresponding array contacts on said test fixture comprising:
   (a) an outer insulating support ring having an circular opening therein;
   (b) a circular transparent flexible contact member having an outer diameter larger than the diameter of said circular opening on said support ring and which is bonded to one surface of said support ring, said flexibel contact member having a two dimensional array of metal contacts on one surface thereon which extend through said contact member to electrical connection means on the opposite surface thereof;
   (c) a circular transparent cover member concentrically mounted in sealed relationship to one surface of said support ring to define, with said support ring and said flexible contact member, a chamber wherein said surface of said contact member having said contacts thereon forms an outer surface of said chamber;
   (d) means to support said integrated circuit die in a plane parallel to the plane of said flexible contact member;
   (e) means for providing laterally movement between said flexible contact member and said integrated circuit die in the plane defined by said contact member to permit said array of integrated circuit die contacts to be precisely aligned with said array of contacts on said contact board through said transparent cover member and said transparent contact member;
   (f) means for admitting a cooling gas under pressure into said chamber to urge said flexible contact member toward an integrated circuit die positioned adjacent said test fixture to establish simultaneous electrical connections between contacts on said integrated circuit die and said contacts on said contact member to permit testing of said integrated circuit die; and (g) means for releasing gas from said chamber at a lower rate than said admitting means to permit said chamber to be pressurized while allowing a moving flow of said cooling gas through said chamber whereby heat generated by said integrated circuit die during testing will be thermally transmitted into said chamber from said contacts on said die through said contacts on said contact member and dissipated in said flow of cooling gas through said chamber.

2. The test fixture apparatus of claim 1 wherein said support ring also comprises a flexible material.

3. The test fixture apparatus of claim 1 wherein vibrational means are provided to impart lateral vibrational movement to said contact array on said contact member with respect to said contact array on said integrated circuit die to clean said die contacts.

4. A test fixture apparatus for testing an integrated circuit die wherein a plurality of contacts arranged in a two dimensional contact on said integrated circuit die may be simultaneously moved into a position of electrical and thermal communication with a corresponding contact array on said test fixture comprising:

(a) an outer insulating support ring having an circular opening therein;

(b) a circular transparent flexible contact member having an outer diameter larger than the diameter of said circular opening on said support ring and which is bonded to one surface of said support ring, said flexible contact member having a two dimensional array of metal contacts on one surface thereon which extend through said contact member to electrical connection means on the opposite surface thereof;

(c) a circular transparent cover member concentrically mounted in sealed relationship to one surface of said support ring to define, with said support ring and said flexible contact member, a chamber wherein said surface of said contact member having said contacts thereon forms an outer surface of said chamber;

(d) means to support said integrated circuit die in a plane parallel to the plane of said flexible contact member;

(e) means for providing laterally movement between said flexible contact member and said integrated circuit die in the plane defined by said contact member to permit said array of integrated circuit die contacts to be precisely aligned with said array of contacts on said contact board through said transparent cover member and said transparent contact member;

(f) vibrational means comprising transducer means to impart a reciprocating lateral vibrational movement between said array of metal contacts on said contact member and said contact array on said integrated circuit die when said transducer is energized to clean said die contacts;

(g) means for admitting a cooling gas under pressure into said chamber to urge said flexible contact member toward an integrated circuit die positioned adjacent said test fixture to establish simultaneous electrical connections between contacts on said integrated circuit die and said contacts on said contact member to permit testing of said integrated circuit die; and (h) means for releasing gas from said chamber at a lower rate than said admitting means to permit said chamber to be pressurized while allowing a moving flow of said cooling gas through said chamber whereby heat generated by said integrated circuit die during testing will be thermally transmitted into said chamber from said contacts on said die through said contacts on said contact member and dissipated in said flow of cooling gas through said chamber.

5. The test fixture apparatus of claim 4 wherein said vibrational means comprise transducer means carried by said contact member to impart a reciprocating lateral motion to said contact member and said contacts thereon when said transducer is energized.

6. The test fixture apparatus of claim 5 wherein said transducer means comprise a discrete transducer affixed to said contact member.

7. The test fixture apparatus of claim 4 wherein said vibrational means comprise discrete transducer means carried by said cover member.

8. The test fixture apparatus of claim 5 wherein said transducer means comprise a transducer formed in situ by using a piezoelectric material to form said contact member, affixing metal electrodes to said contact member, and energizing said in situ formed transducer by applying an AC voltage of ultrasonic frequency to said electrodes.

9. The test fixture apparatus of claim 8 wherein said transducer means comprise a pair of metal electrodes affixed to opposite sides of said flexible contact member.

10. The test fixture apparatus of claim 8 wherein said transducer means comprise a pair of metal electrodes affixed to the same side of said flexible contact member.

11. The test fixture apparatus of claim 10 wherein said pair of metal electrodes affixed to the same side of said flexible contact member comprising said transducer means further comprises two or more interdigitated electrodes.

12. The test fixture of claim 4 wherein a rigid support member is interposed between said cover and said insulating support ring.

13. A test fixture apparatus for testing an integrated circuit die wherein a plurality of contacts arranged in a two dimensional array on said integrated circuit die may be simultaneously moved into a position of electrical and thermal communication with a corresponding array of contacts on said test fixture and said die contacts may be cleaned by said apparatus prior to said testing of said die comprising:

(a) an outer insulating support ring having an circular opening therein;

(b) a flexible transparent contact member bonded to a first surface of said support ring and having an outer diameter larger than said circular opening on said support ring whereby said flexible member sealingly covers said opening, said flexible member having a two dimensional array of metal contacts on one surface thereof which extend through said contact board to electrical connection means on the opposite surface thereof;

(c) a circular transparent cover member concentrically mounted in sealed relationship to the opposite surface of said support ring to define, with said support ring and said flexible contact member, a chamber wherein the outer surface of said contact member having said contacts thereon forms an outer surface of said chamber;

(d) means to support said integrated circuit die in a plane parallel to the plane of said flexible contact member;

(e) means for providing laterally movement between said flexible contact member and said integrated circuit die in the plane defined by said contact member to permit said array of integrated circuit die contacts to be precisely aligned with said array of contacts on said contact member through said transparent cover member and said transparent flexible contact member;

(f) means for admitting a cooling gas under pressure into said chamber to urge said contact member toward an integrated circuit die positioned adjacent said test fixture to establish simultaneous electrical connections between contacts on said integrated circuit die and said contacts on said contact member to permit testing of said integrated circuit die;

(g) means for releasing gas from said chamber at a lower rate than said admitting means to permit said chamber to be pressurized while allowing a moving flow of said cooling gas through said chamber whereby heat generated by said integrated circuit die during testing will be thermally transmitted into said chamber from said contacts on said die through said contacts on said flexible contact member and dissipated in said flow of cooling gas through said chamber; and (h) vibrational means to impart reciprocating lateral movement to said contacts on said flexible contact member with respect to said die contacts while said contacts on said contact member are urged under pressure against said die contacts to thereby remove oxides or other resistive material from the surface of said die contacts prior to electrical testing of said integrated circuit die.

* * * * *